United States Patent
Lee et al.

(10) Patent No.: US 6,644,387 B1
(45) Date of Patent: Nov. 11, 2003

(54) HEAT SINK ASSEMBLY WITH SPRING CLAMP

(75) Inventors: Hsieh Kun Lee, Tu-Chen (TW);
WeLLint Xia, Shenzhen (CN); Gencai Wang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/364,181

(22) Filed: Feb. 10, 2003

(30) Foreign Application Priority Data

Jun. 20, 2002 (TW) ....................... 91209262 U

(51) Int. Cl.⁷ ................................ H05K 7/20
(52) U.S. Cl. ................ 165/80.3; 361/704; 257/718; 257/719
(58) Field of Search ................ 165/80.3, 185; 361/704, 710; 257/718, 719; 174/16.3

(56) References Cited

U.S. PATENT DOCUMENTS

| | | | |
|---|---|---|---|
| 5,386,338 A | * 1/1995 | Jordan et al. | 361/704 |
| 6,392,886 B1 | * 5/2002 | Lee et al. | 361/703 |
| 6,518,507 B1 | * 2/2003 | Chen | 174/252 |
| 6,538,891 B1 | * 3/2003 | He et al. | 361/704 |

* cited by examiner

Primary Examiner—Allen Flanigan
(74) Attorney, Agent, or Firm—Wei Te Chung

(57) ABSTRACT

A heat sink assembly includes a heat sink (20), a clip (40), and a spring clamp (60). The heat sink includes a base (21), pin fins (23), and slots (25, 27) defined between respective adjacent rows of the pins in perpendicular crisscross fashion. The clip made from a flexible metal wire includes a central body (41) with a raised portion (43), and two arms (45) extending perpendicularly but in different directions from opposite ends of the body. A hook (47) is formed at a free end of each arm. The spring clamp includes an elongate central pressing portion (61). A longitudinal opening (63) defined in the pressing portion engagingly receives the raised portion. Two pairs of elastically deformable wings (65) extend from respective opposite sides of the pressing portion. The clamp is resiliently retained in corresponding slots of the heat sink, and thus secures the clip to the heat sink.

17 Claims, 4 Drawing Sheets

HEAT SINK ASSEMBLY WITH SPRING CLAMP

BACKGROUND OF THE INVENTION

1. Field of the Invention

The present invention relates to heat sink assemblies used to dissipate heat from electronic devices, and more particularly to a heat sink assembly having a spring clamp for securely retaining a clip in a heat sink of the assembly.

2. Related Art

Advancements in microelectronics technology has resulted in electronic devices such as central processing units (CPU) that are able to process signals at unprecedented high speeds. During operation of such electronic devices, large amounts of heat are produced. The heat must be efficiently removed, to prevent the electronic device from becoming unstable or damaged. A heat sink assembly is commonly used to dissipate heat from the electronic device.

A typical heat sink assembly comprises a heat sink and a clip. The clip is used to fasten the heat sink onto an electronic device. An example of a conventional heat sink assembly is disclosed in U.S. Pat. No. 5,464,054. In this assembly, a wire clip fastens a heat sink onto an electronic device. The wire clip comprises a central portion and two fastening portions respectively extending from opposite ends of the central portion. The heat sink comprises a base, and a plurality of pin fins extending upwardly from the base. A longitudinal slot is defined in the base for receiving the central portion of the clip. A plurality of barbs is formed on the base along the slot. The central portion of the wire clip is retained in the slot by the barbs. A hook is formed at a free end of each fastening portion, for engaging in a corresponding hole of a motherboard. The hooks thereby resiliently secure the heat sink to the electronic device. However, it is laborious to manipulate the central portion of the wire clip so that it is retained in the slot of the heat sink by the barbs. In addition, when the assembly is subjected to vibration or shock during use, the clip is prone to rotate in a plane that is parallel to the base, and is prone to be displaced in directions that are parallel to the slot. This can adversely affect thermal engagement of the heat sink with the electronic device.

Another example of a conventional heat dissipating assembly is disclosed in U.S. Pat. No. 5,386,338. The assembly comprises a wire clip for attaching a heat sink to an electronic device. A spring clamp is also required. The clamp has a semicircular bottom for receiving a central portion of the clip, and two spring lugs extending from opposite sides of the semicircular bottom. The clamp fastens the wire clip onto the base of the heat sink via the lugs. However, the wire clip is prone to rotation and displacement, in much the same way as the wire clip of the heat sink assembly described in the above paragraph.

In view of the above, an improved heat sink assembly with a spring clamp which overcomes the above-mentioned problems is strongly desired.

BRIEF SUMMARY OF THE INVENTION

Accordingly, an object of the present invention is to provide a heat sink assembly having a spring clamp which facilitates assembly thereof, the spring clamp having a simple structure.

Another object of the present invention is to provide a heat sink assembly including a heat sink and a wire clip attached to the heat sink with a spring clamp, whereby the heat sink assembly has a simple structure and is easily assembled.

To achieve the above-mentioned objects, a heat sink assembly of the present invention is used to attach a heat sink onto a heat-generating electronic device mounted on a motherboard. The heat sink assembly comprises the heat sink, a clip and the spring clamp. The heat sink has a base, and a plurality of heat dissipating pin fins extending upwardly from the base. A plurality of slots is defined between respective adjacent rows of the pins, in perpendicular crisscross fashion. The clip is made from a flexible metal wire. The clip comprises a central body with a raised portion in a middle thereof, and two arms respectively extending perpendicularly but in different directions from opposite ends of the central body. A hook is formed at a free end of each arm. The spring clamp comprises an elongate central pressing portion. A longitudinal opening is defined in the pressing portion, engagingly receiving the raised portion of the clip therein. Two pairs of elastically deformable wings extend from respective opposite sides of the pressing portion. The clamp is resiliently retained in corresponding slots of the heat sink, and thus secures the clip to the heat sink.

Other objects, advantages and novel features of the present invention will be drawn from the following detailed description of preferred embodiments of the present invention together with the attached drawings, in which:

DESCRIPTION OF PREFERRED EMBODIMENTS

Figure 1:
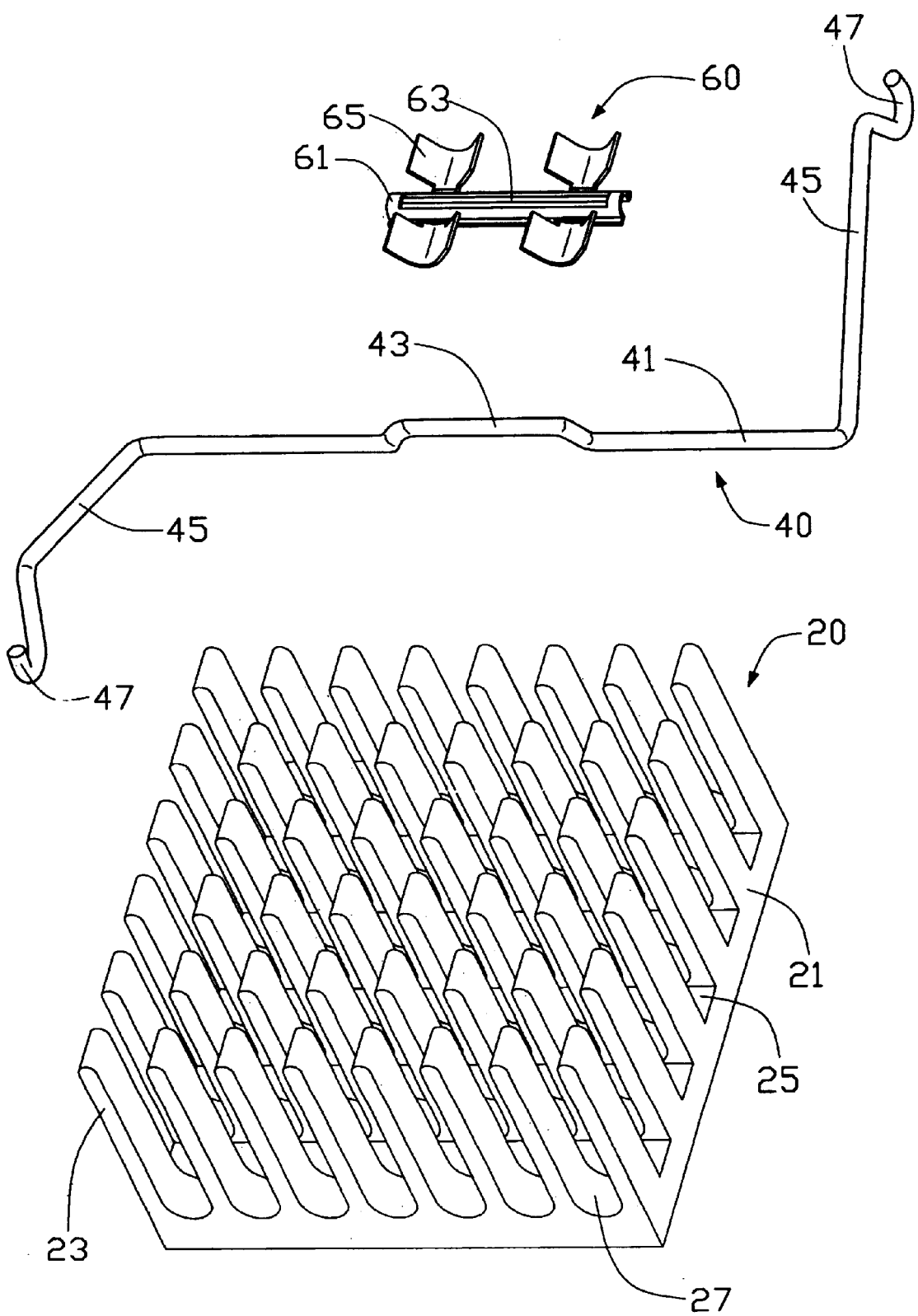
FIG. 1 is an exploded, isometric view of a heat sink assembly in accordance with a preferred embodiment of the present invention.
Figure 2:
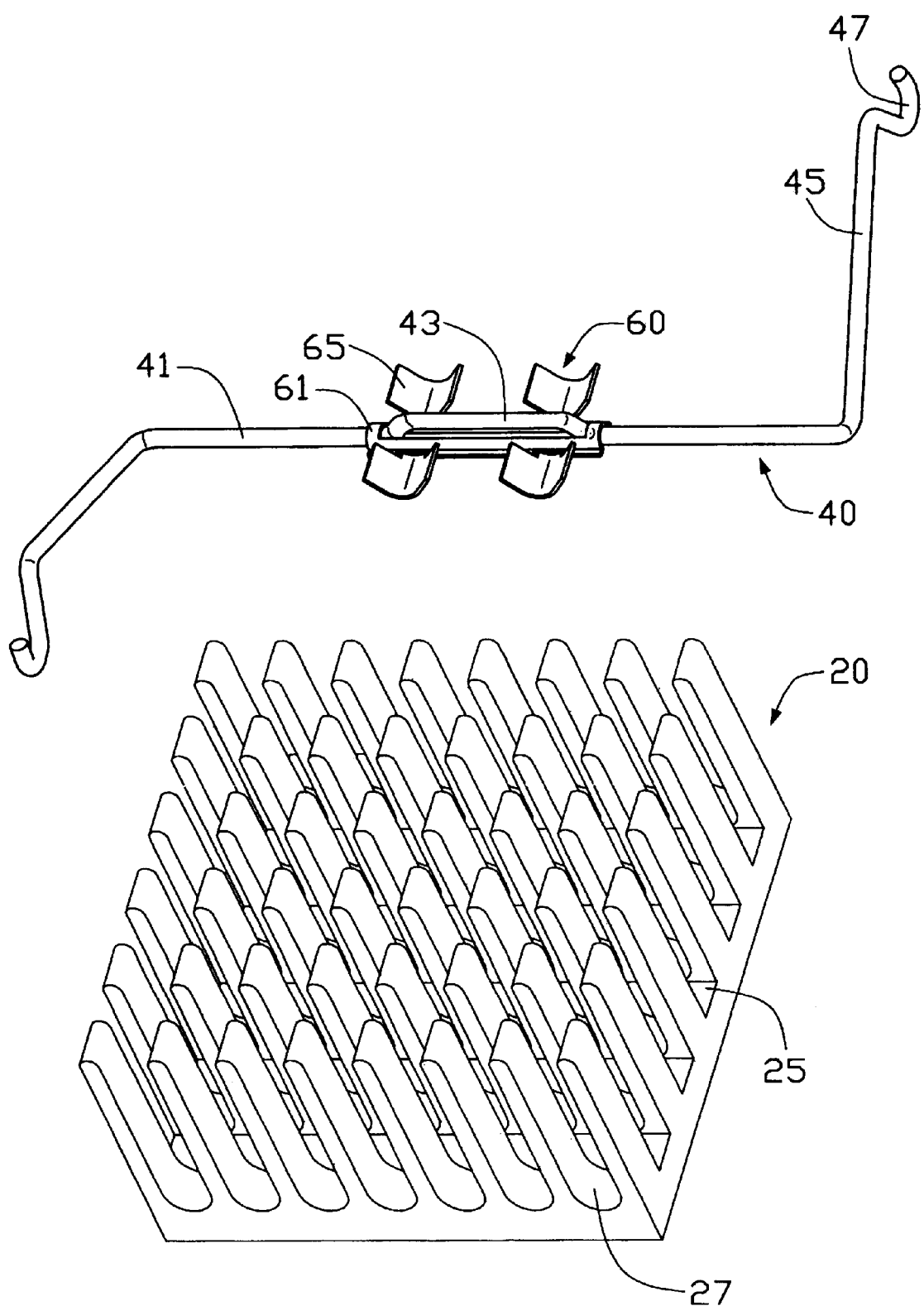
FIG. 2 is a partly assembled view of FIG. 1.
Figure 3:
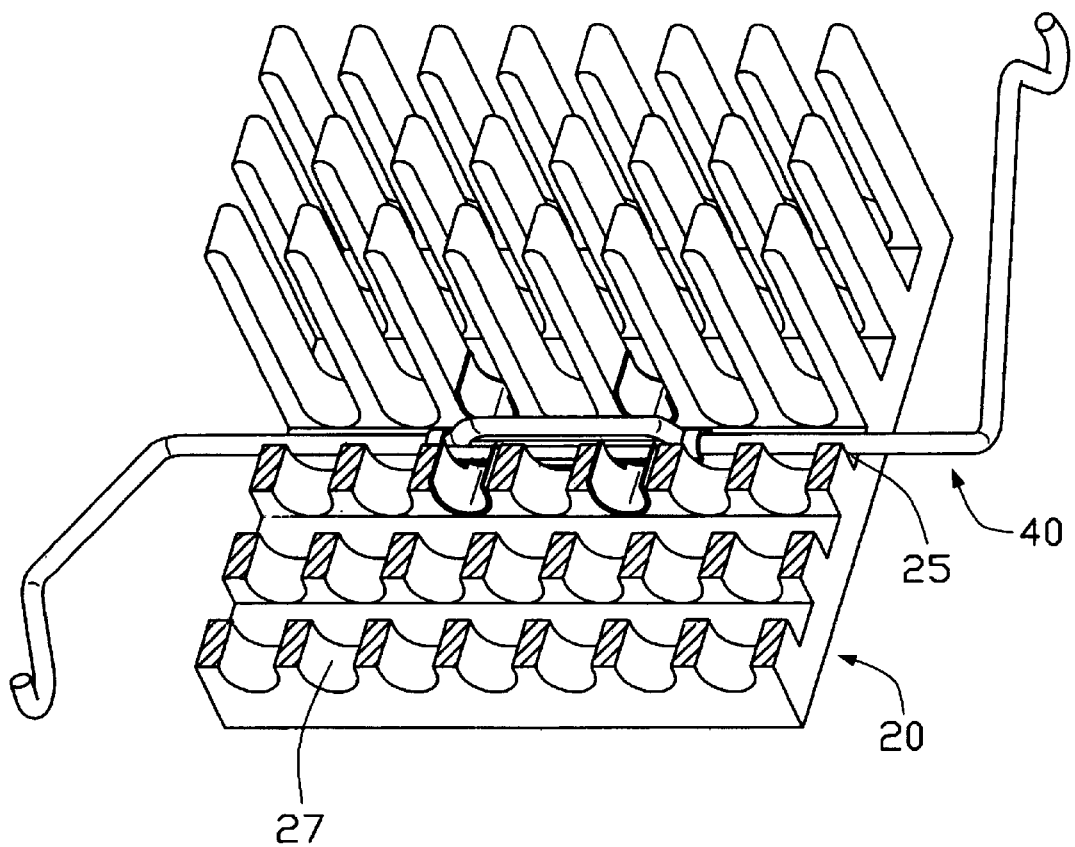
FIG. 3 is a fully assembled view of FIG. 1, but with part of a heat sink of the heat sink assembly cut away for clearer illustration.

Referring to FIGS. 1–3, a heat sink assembly in accordance with a preferred embodiment of the present invention comprises a heat sink 20, a clip 40 and a spring clamp 60. The heat sink 20 has a base 21, and a plurality of heat dissipating pin fins 23 extending upwardly from the base 21 and arranged in a rectangular array. A plurality of parallel first slots 25 is defined between respective adjacent rows of the pins 23. A plurality of parallel second slots 27 is also defined between respective adjacent rows of the pins 23, the second slots 27 being perpendicular to the first slots 25.

The clip 40 is made from a flexible metal wire, and comprises a central body 41 and two spring arms 45 respectively extending perpendicularly but in different directions from opposite ends of the body 41. A raised portion 43 is formed in a middle of the body 41. A hook 47 is formed at a free end of each spring arm 45, for engaging in a corresponding hole of a circuit substrate such as a motherboard. The hooks 47 thereby resiliently fasten the heat sink 20 onto a heat-generating electronic package such as a central processing unit (CPU) that is mounted on the motherboard.

The spring clamp 60 comprises an elongate central pressing portion 61 having a semicircular profile. A longitudinal opening 63 is defined in the pressing portion 61, for engagingly receiving the raised portion 43 of the clip 40 therethrough. Two pairs of elastically deformable wings 65 extend from respective opposite sides of the pressing portion 61, for engaging with corresponding pins 23 of the heat sink 20. Each wing 65 has a generally U-shaped profile.

Referring particularly to FIGS. 2–3, in assembly, the raised portion 43 of the body 41 of the clip 40 is received in the opening 63 of the pressing portion 61 of the clamp 60. The pressing portion 61 is thus fastened on the body 41 by tensile force, so that the clamp 60 and the clip 40 cooperate as a single unit. The combined clip 40 and clamp 60 is received in a centermost of the first slots 25 of the heat sink 20, with the wings 65 simultaneously being received in corresponding second slots 27 of the heat sink 20. The wings 65 prevent the clip 40 from moving in directions parallel to the first slots 25. The wings 65 resiliently fit between corresponding pins 23. The wings 65 thereby interferentially prevent the clip 20 from moving in directions parallel to the second slots 27, and in a direction away from the base 21 of the heat sink 20.

Figure 4:
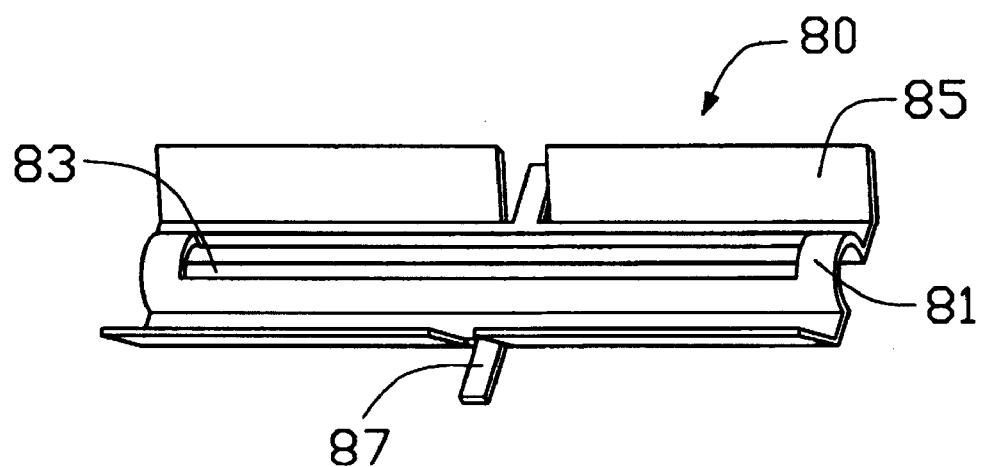
FIG. 4 is an isometric view of a clamp of a heat sink assembly in accordance with an alternative embodiment of the present invention.

Referring to FIG. 4, a clamp 80 in accordance with an alternative embodiment of the present invention comprises an elongate central pressing portion 81 having a semicircular profile. A longitudinal opening 83 is defined in the pressing portion 81, for engagingly receiving the raised portion 43 of the clip 40 therethrough. A pair of symmetrically opposing spring wings 85 extends outwardly and upwardly from respective opposite longitudinal sides of the pressing portion 81. Two latches 87 extend perpendicularly outwardly in opposite directions from central portions of the wings 85 respectively. The clamp 80 is attached to the clip 40, and the combined clip 40 and clamp 80 is received in a centermost of the first slots 25 of the heat sink 20. The wings 85 prevent the clip 40 from moving in directions parallel to the second slots 27. The wings 85 resiliently fit between corresponding pins 23 of the heat sink 20. The wings 85 thereby interferentially prevent the clip 20 from moving in directions parallel to the first slots 25 of the heat sink 20, and in a direction away from the base 21 of the heat sink 20. The latches 87 prevent the clip 20 from moving in the directions parallel to the first slots 25.

Instead of the prior arts using the deformable clamp receiving and trapping the central portion of the clip therein and commonly loaded to the heat sink, the instant invention uses a pressing portion cooperating with the heat sink to sandwich the clip therebetween wherein the clip further includes a raised portion extending through and restrained in an opening of the pressing portion to prevent rotation of the clip, that can not be achieved by the prior arts. It should be noted that in the prior arts the rotation/twisting of the central portion occurs along the whole length thereof and engagement/disengagement of one leg may influence the other leg via said twisting transmission. Oppositely, with the raised portion restricted in the opening for anti-rotation, such engagement/disengagement on the two legs are isolated from each other, thus resulting in more reliable of the whole assembly.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat sink assembly, comprising:
   a heat sink having a base, and a plurality of pins extending upwardly from the base;
   a clip having a central body with a raised portion, and a pair of spring arms respectively extending perpendicularly but in different directions from two opposite ends of the body, a hook being formed at a free end of each of the arms; and
   a spring clamp having a pressing portion, an opening defined in the pressing portion engagingly receiving the raised portion of the clip, and a plurality of elastically deformable wings extending from respective opposite sides of the pressing portion and engaging with corresponding pins of the heat sink.

2. The heat sink assembly as described in claim 1, wherein the clip is made from a flexible metal wire.

3. The heat sink assembly as described in claim 1, wherein a plurality of first slots is defined between respective adjacent rows of the pins, and a plurality of second slots is defined between respective adjacent rows of the pins, the second slots being perpendicular to the first slots.

4. The heat sink assembly as described in claim 1, wherein the pressing portion has a generally semicircular profile.

5. The heat sink assembly as described in claim 3, wherein each of the wings has a generally U-shaped profile.

6. The heat sink assembly as described in claim 5, wherein the combined clip and the clamp is received in a centermost one of the first slots of the heat sink, with the wings simultaneously being received in corresponding second slots of the heat sink.

7. The heat sink assembly as described in claim 3, wherein the wings extend outwardly and upwardly from respective opposite longitudinal sides of the pressing portion.

8. The heat sink assembly as described in claim 7, wherein the clip combined with the clamp is received in a centermost one of the first slots of the heat sink.

9. The heat sink assembly as described in claim 8, wherein two latches extend outwardly in opposite directions from central portions of the wings respectively.

10. A heat sink assembly, comprising:
    a heat sink having a base, a plurality heat dissipating pins extending upwardly from the base, and a plurality of first slots and a plurality of second slots defined between respective adjacent rows of the pins, the second slots being perpendicular to the first slots;
    a clip having a central body with a raised portion, and a pair of spring arms respectively extending perpendicularly but in different directions from two opposite ends of the body, a hook being arranged at a free end of each of the arms; and
    a spring clamp having an elongate central pressing portion receiving the raised portion of the clip, a plurality of elastically deformable wing extending outwardly and upwardly from respective opposite longitudinal sides of the pressing portion, and two latches extending perpendicularly outwardly in opposite directions from central portions of the wings respectively, wherein
    the clip combined with the clamp is received in a centermost one of the first slots of the heat sink, the wings resiliently fit between corresponding pins of the heat sink, and the latches prevent the clip from moving in directions parallel to the first slots.

11. The heat sink assembly as described in claim 10, wherein the clip is made from a flexible metal wire.

12. The heat sink assembly as described in claim 10, wherein the pressing portion has a generally semicircular profile.

13. The heat sink assembly as described in claim 12, wherein a longitudinal opening is defined in the pressing portion, the opening engagingly receiving the raised portion of the clip.

14. A heat sink assembly comprising:

a heat sink defining a base with a plurality of fins upwardly extending therefrom, said fins being arranged in rows and columns;

a clip defining a central portion with a raised portion thereof, and a pair of spring arms extending from two opposite ends of the central portion, each of said spring arms defining a hook at a free end thereof;

an anti-rotation device including a pressing portion pressing downwardly against the central portion with an opening, which said raised portion extends through and is at least partially restrained in, for restricting lateral movement of the raised portion and thus preventing rotation of the central portion;

wherein
the anti-rotation device further includes an anti-linear movement device engaged with the corresponding fins for preventing linear movement thereof relative to the heat sink.

15. The assembly as described in claim 14, wherein said anti-linear movement device includes wings extending from the pressing portion and along a longitudinal direction of the pressing portion.

16. The assembly as described in claim 14, wherein said anti-linear movement device includes wings located by two sides of the pressing portion and extending in a lateral direction perpendicular to said longitudinal direction.

17. The assembly as described in claim 16, wherein said rows are defined along said longitudinal direction while said columns are defined along said lateral direction.

* * * * *